(12) United States Patent
Tsai (10) Patent No.: US 8,419,460 B2
(45) Date of Patent: Apr. 16, 2013

(54) ELECTRIC CONNECTOR

(75) Inventor: Chia Yen Tsai, Dongguan (CN)

(73) Assignee: Suyin Electronics (Dongguan) Co., Ltd., Guangdong Province (CN)

( * ) Notice: Subject to any disclaimer, the term of this patent is extended or adjusted under 35 U.S.C. 154(b) by 87 days.

(21) Appl. No.: 13/235,377

(22) Filed: Sep. 17, 2011

(65) Prior Publication Data

US 2013/0072066 A1    Mar. 21, 2013

(51) Int. Cl.
   *H01R 4/50*    (2006.01)
(52) U.S. Cl.
   USPC .......................................................... 439/342
(58) Field of Classification Search .................. 439/342, 439/259, 264, 268, 331; 24/580.1
   See application file for complete search history.

(56) References Cited

U.S. PATENT DOCUMENTS

| | | | | |
|---|---|---|---|---|
| 2,150,361 A * | 3/1939 | Chobert | ........................... | 29/512 |
| 3,204,514 A * | 9/1965 | Sauvet | ........................... | 411/385 |
| 4,504,249 A * | 3/1985 | Fortier et al. | ................... | 474/33 |
| 5,274,885 A * | 1/1994 | Hellweg | .......................... | 24/3.12 |
| 5,368,427 A * | 11/1994 | Pfaffinger | ..................... | 411/553 |
| 6,254,415 B1 * | 7/2001 | Mizumura et al. | ........... | 439/342 |
| 6,338,640 B1 * | 1/2002 | Lin | ................................ | 439/342 |
| 6,354,862 B1 * | 3/2002 | Matso | ........................... | 439/392 |
| 6,450,827 B1 * | 9/2002 | Huang et al. | .................. | 439/342 |
| 6,464,525 B2 * | 10/2002 | Mizumura | .................... | 439/342 |
| 6,669,500 B1 * | 12/2003 | Ju | .................................. | 439/342 |
| 6,921,276 B2 * | 7/2005 | McClinton | .................... | 439/342 |
| 7,056,140 B1 * | 6/2006 | Jiang | ............................. | 439/342 |
| 7,081,026 B2 * | 7/2006 | Schwarz | ....................... | 439/729 |
| 7,572,136 B2 * | 8/2009 | Liao | .............................. | 439/342 |
| 7,753,707 B1 * | 7/2010 | Ju | ................................ | 439/342 |
| 7,771,224 B2 * | 8/2010 | Cheng et al. | .................. | 439/342 |
| 7,878,839 B2 * | 2/2011 | Cheng et al. | .................. | 439/342 |
| 7,918,681 B2 * | 4/2011 | Ju | ................................ | 439/342 |
| 7,938,666 B2 * | 5/2011 | Xiao et al. | ..................... | 439/342 |
| 7,963,791 B1 * | 6/2011 | Cai | ................................ | 439/342 |
| 7,985,084 B2 * | 7/2011 | Chien | ........................... | 439/135 |
| 8,021,180 B2 * | 9/2011 | Ju | ................................ | 439/342 |
| 8,142,216 B1 * | 3/2012 | Xiao et al. | ..................... | 439/342 |
| 8,202,109 B2 * | 6/2012 | Zhou et al. | ..................... | 439/342 |
| 2008/0280473 A1 * | 11/2008 | Zhou et al. | ..................... | 439/259 |

\* cited by examiner

*Primary Examiner* — Renee Luebke
*Assistant Examiner* — Vladimir Imas (57) ABSTRACT

An electric connector includes an insulation base, a cover which is slidably connected to the base and an eccentric driving cam which is connected to the insulation base and the cover. The insulation base has a first limit surface. The cover has a second limit surface. The eccentric driving cam includes a first stop surface and a second stop surface. The first stop surface is stopped by the first limit surface and the second stop surface is stopped by the second limit surface, providing a dual-stop effect.

9 Claims, 12 Drawing Sheets

ELECTRIC CONNECTOR

BACKGROUND OF THE INVENTION

1. Field of the Invention

The present invention relates to an electric connector to connect a central processing unit and a motherboard, and more particularly to an electric connector driving by a cam.

2. Description of the Prior Art

A conventional electric connector to connect a central processing unit and a motherboard comprises an insulation base and a cover. The cover has a plurality of upper receiving holes, and the insulation base has a plurality of lower receiving holes corresponding to the upper receiving holes. Each lower receiving hole is provided with a socket terminal. A driving device is connected to the cover and the insulation base and used to open or close the electric connector. When the electric connector is in a disconnection state, the pins of the CPU chip module are not contact with the corresponding socket terminals. After that, the driving device is operated to move the cover toward one side of the insulation base for the pins of the central processing unit to electrically contact with the socket terminals in the lower receiving holes. At this time, the central processing unit is in a closed state. When the driving device is operated to move the cover toward the other side of the insulation base, the pins of the central processing unit disconnect from the socket terminals in the lower receiving holes. The central processing unit is in a disconnection state.

The driving device of the conventional electric connector is an eccentric driving cam. The eccentric driving cam includes a first post, a second post, a third post and a forth post from top to bottom. The radius of each post is reduced in turn. The first and second posts are coaxial, and the third and fourth posts are coaxial. The two axles are interlaced a certain distance to form the eccentric cam, so that the insulation base is driven to move relative to the cover. One side of the first post is integrally formed with a stop portion. The stop portion has two stop surfaces at two sides thereof. The stop surfaces are parallel to the sliding direction of the cover. The cover has a limit recess thereon corresponding to the stop portion. The limit recess has two limit surfaces at two sides thereof. During use, the stop portion of the eccentric driving cam mates with the limit recess. When the eccentric driving cam is turned to be an open state or a closed state, the limit surfaces are used to stop the stop portion in order to stop the eccentric driving cam.

The eccentric driving cam of this electric connector can be used to connect the CPU chip model and the electric connector or disconnect the CPU chip module and the electric connector. However, the limit surfaces of the cover bear all the driving force. When the force is applied too much, the cover may be broken off. This is not beneficial to the life span of the product.

Besides, the stop surfaces are parallel to the sliding direction of the cover. When the eccentric driving cam is turned to be open or closed, the direction of the applied force and the sliding direction of the cover are not the same. It needs much torsion force to connect the electric connector and the CPU chip module. Accordingly, the inventor of the present invention has devoted himself based on his many years of practical experiences to solve these problems.

SUMMARY OF THE INVENTION

The primary object of the present invention is to provide an electric connector to solve the problems of the prior art. The electric connector can disperse the driving force of the eccentric driving cam to the cover and the insulation base, proving a dual-stop effect and preventing the cover from bearing the applied force alone.

Another object of the present invention is that the direction of the applied force of the eccentric driving cam is the same as the sliding direction of the cover to effectively decrease the driving force of the eccentric driving cam. Only little torsion force is required to drive the electric connector.

In order to achieve the aforesaid object, the electric connector of the present invention comprises an insulation base, a cover which is slidably connected to the base and an eccentric driving cam which is connected to the insulation base and the cover.

The insulation base has a plurality of lower receiving holes thereon, an axle hole which is disposed at a portion not having the lower receiving holes and a limit recess which surrounds the axle hole. The limit recess has two first limit surfaces at two ends thereof.

The cover has a plurality of upper receiving holes thereon corresponding to the lower receiving holes, a through hole which is disposed at a portion not having the upper receiving holes and corresponds in position to the axle hole, and a limit block at one side of the through hole. The limit block has two second limit surfaces at two sides thereof.

The eccentric driving cam comprises a driving portion and a rotation axle. The driving portion has two second stop surfaces at two ends thereof. The rotation axle has a stop portion thereon. The stop portion extends into the limit recess. The stop portion has two first stop surfaces at two ends thereof.

Wherein the eccentric driving cam drives the cover to slide relative to the insulation base by a torsion action, when sliding to a predetermined position, the first stop surfaces are stopped by the first limit surfaces and the second stop surfaces are stopped by the second limit surfaces.

The present invention has the following effects.

Through the limit recess surrounding the axle hole of the insulation base, the eccentric driving cam can be stopped by the cover and the insulation base to disperse the driving force and to provide a dual-stop effect, preventing the cover from breaking off.

Through a metallic spacer received in an accommodation chamber of a cover platform of the cover, the metallic spacer has an opening and a protruding block which is located at a side of the opening. The protruding block corresponds to the limit block. The protruding block has two third limit surfaces at two sides thereof. When the eccentric driving cam is turned by a torsion force, the first stop surfaces of the eccentric action portion are against the third limit surfaces. When the eccentric driving cam is turned to a predetermined position, the eccentric driving cam is stopped by the third limit surfaces, the second limit surfaces and the first limit surfaces to disperse the driving force to the metallic spacer and to enhance the stop effect of the eccentric driving cam. Because the metal has a high hardness and doesn't deform and split easily, so the limit block made of a metallic material won't be broken off.

The first limit surfaces are perpendicular to the sliding direction of the cover and the direction of the applied force of the eccentric action portion is the same as the sliding direction of the cover, so that only little torsion force is required to drive the electric connector and the coupled central processing unit module.

DETAILED DESCRIPTION OF THE PREFERRED EMBODIMENTS

Embodiments of the present invention will now be described, by way of example only, with reference to the accompanying drawings.

As shown in FIG. 1 through FIG. 10, the electric connector according to a first embodiment of the present invention comprises an insulation base 10, a cover 20 which is slidably connected to the base 10, and an eccentric driving cam 30 which is connected to the insulation base 10 and the cover 20.

Figure 1:
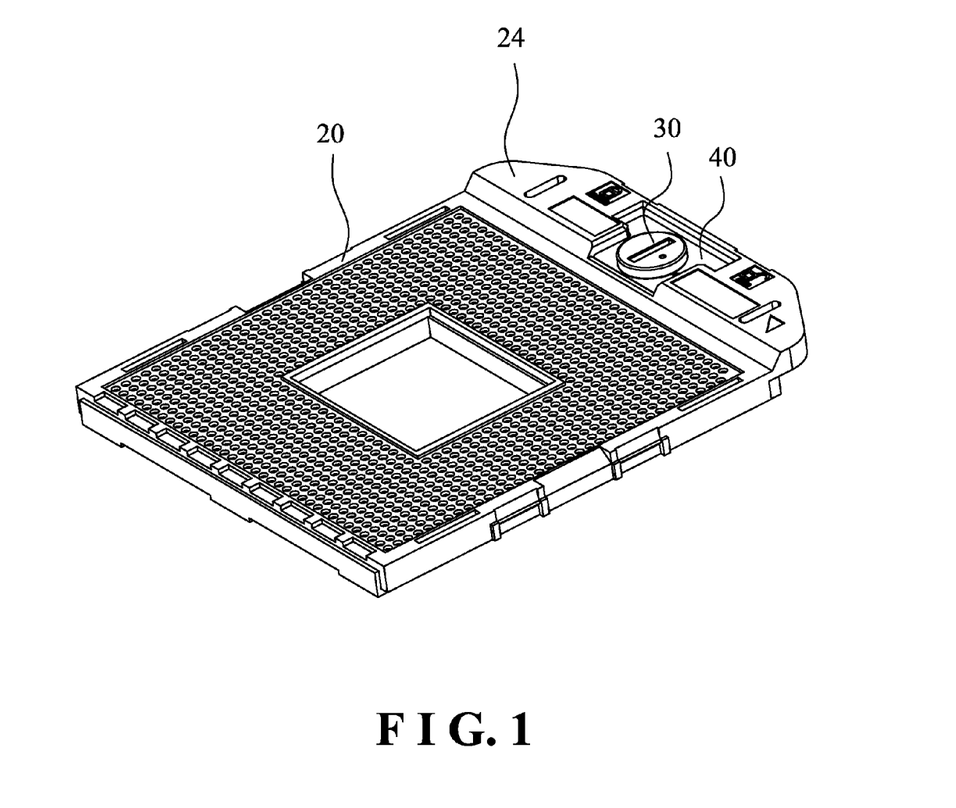
FIG. 1 is a perspective view according to a first embodiment of the present invention.

In this embodiment, the front, rear, left, right directions described hereinafter are based on FIG. 1. The detailed structure of the electric connector is as follows.

Figure 2:
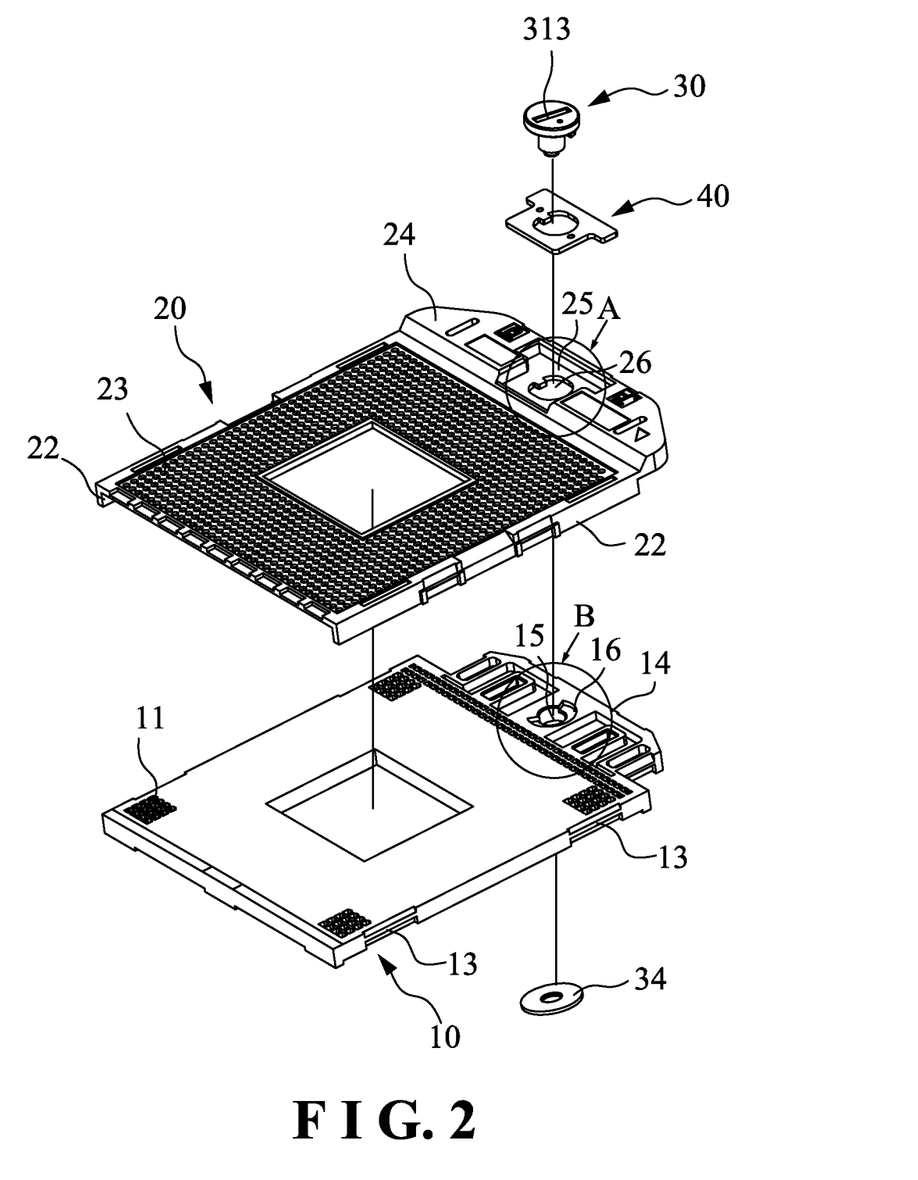
FIG. 2 is an exploded view according to the first embodiment of the present invention.
Figure 3:
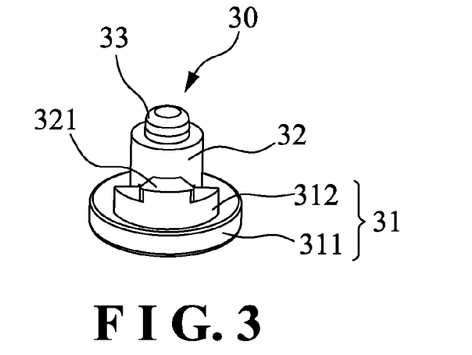
FIG. 3 is an enlarged view of the eccentric driving cam according to the first embodiment of the present invention.
Figure 7:
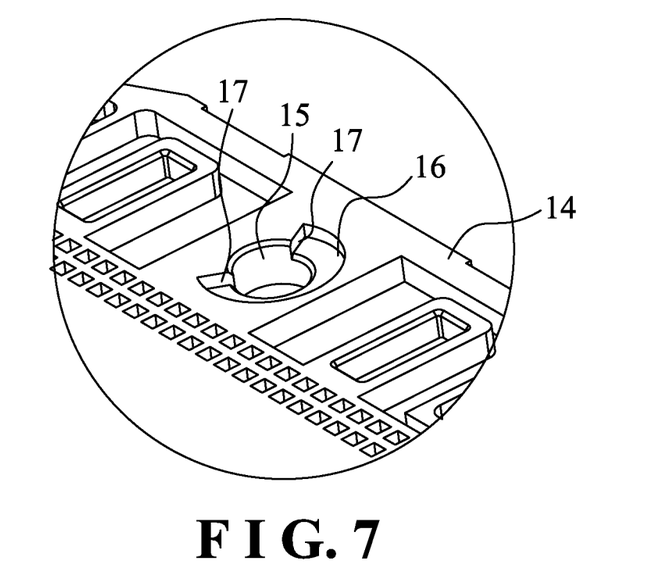
FIG. 7 is an enlarged view of the circle B in FIG. 2.

As shown in FIG. 2 and FIG. 7, the insulation base 10 is in a square flat shape and used to connect a circuit board. The insulation base 10 has a plurality of lower receiving holes 11 thereon to receive socket terminals. The insulation base 10 comprises a plurality of engaging blocks 13 at two sides thereof. The insulation base 10 comprises a base platform 14 extending from a front side thereof. The base platform 14 has an axle hole 15 defined in a central portion of the base platform 14. The base platform 14 further has a limit recess 16 which surrounds the right side of the axle hole 15 and communicates with the axle hole 15. The limit recess 16 has a fan-shaped shape. The limit recess 16 and the axle hole 15 are coaxial, and the diameter of the limit recess 16 is larger than that of the axle hole 15. The fan-shaped limit recess 16 has two first limit surfaces 17 defined at two ends thereof.

Figure 6:
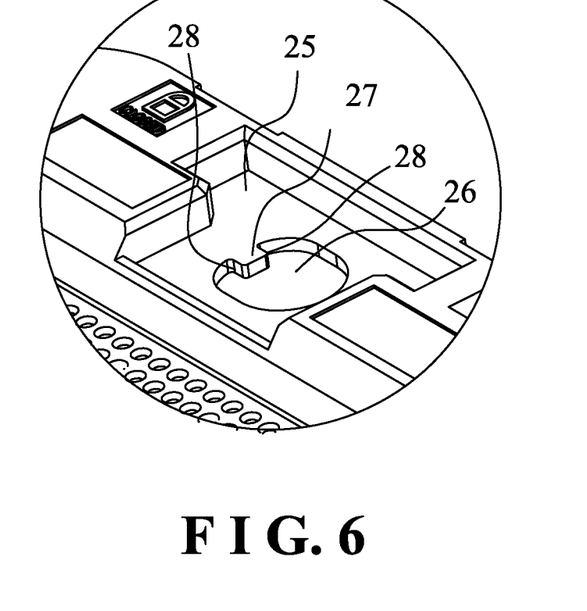
FIG. 6 is an enlarged view of the circle A in FIG. 2.

As shown in FIG. 2 and FIG. 6, the cover 20 is also in a square flat shape and used to receive a chip module of a central processing unit. Two sides of the cover 20 are bent downward to form two flanges 22. The flanges 22 are provided with engaging hooks inner sides thereof, not shown in the drawings, to connect the engaging blocks 13 at the two sides of the insulation base 10. The cover 20 has a plurality of upper receiving holes 23 thereon. The upper receiving holes 23 mate with the lower receiving holes 11. The cover 20 comprises a cover platform 24 extending from a front side thereof. The cover platform 24 is substantially in a trapezoid plate shape. The cover platform 24 has a 凸-shaped accommodation chamber 25 at a central portion thereof and an oval-like through hole 26 disposed in the accommodation chamber 25. The through hole 26 corresponds in position to the axle hole 15. The through hole 26 has a limit block 27 therein. The limit block 27 protrudes from an inner wall of the through hole 26 in a direction perpendicular to a sliding direction of the cover 20. The limit block 27 has two second limit surfaces 28 at two side walls thereof. The two second limit surfaces 28 are parallel to each other and perpendicular to the sliding direction of the cover 20. In this embodiment, the limit block 27 is located in the through hole 26, but is not limited. The limit block 27 may be disposed in the axle hole 15 of the insulation base 10.

Figure 4:
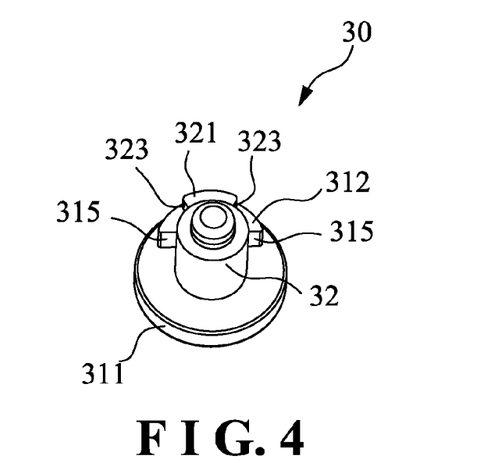
FIG. 4 is another schematic view of FIG. 3.
Figure 8:
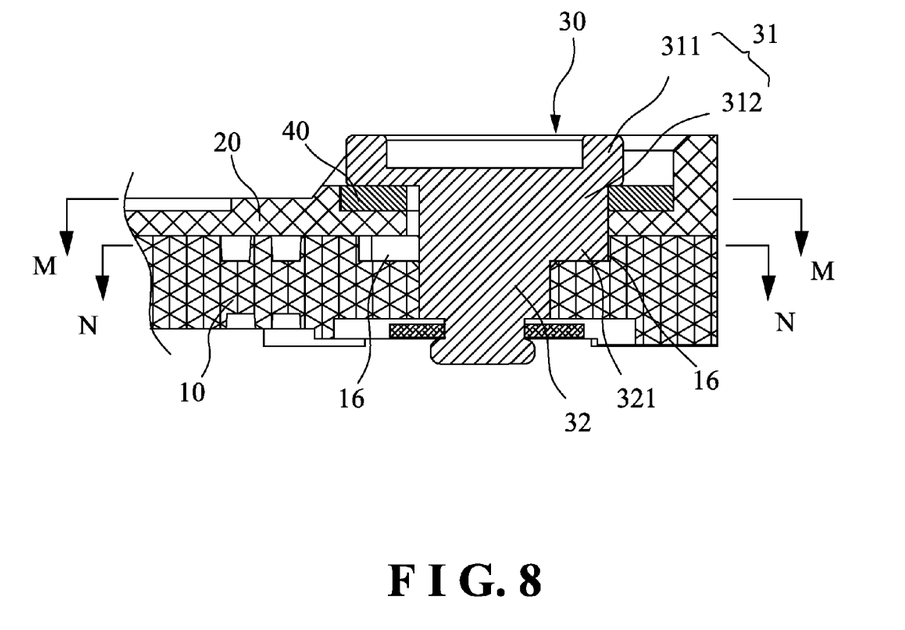
FIG. 8 is a cross-sectional view according to the first embodiment of the present invention.

As shown in FIG. 2 and FIG. 4, the eccentric driving cam 30 comprises a driving portion 31 and a rotation axle 32. The driving portion 31 comprises an operation head 311 and an eccentric action portion 312. The operation head 311 has a notch 313 on an upper surface thereof. The notch 313 has two top walls at two ends thereof. The eccentric action portion 312 has two second stop surfaces 315 at two ends thereof. The rotation axle 32 has a stop portion 321 at an upper end thereof. The stop portion 321 is a fan-shaped block which extends from a bottom of the eccentric action portion 312 and is integrally formed with the eccentric action portion 312. The stop portion 321 has two first stop surfaces 323 at two ends thereof. The depth of the stop portion 321 is the same as that of the fan-shaped limit recess 16, so that the stop portion 321 can extend into the fan-shaped limit recess 16 exactly. As shown in FIG. 8, during driving, the eccentric driving cam 30 drives the cover 20 to slide on the insulation base 10 by the torsion action. When the sliding reaches the predetermined position, the first stop surfaces 323 are stopped by the first limit surfaces 17 and the second stop surfaces 315 are stopped by the second limit surfaces 28. Furthermore, the rotation axle 32 has a reduced rivet portion 33 which extending from a bottom thereof. The rivet portion 33 is used to connect a rivet piece 34.

Figure 5:
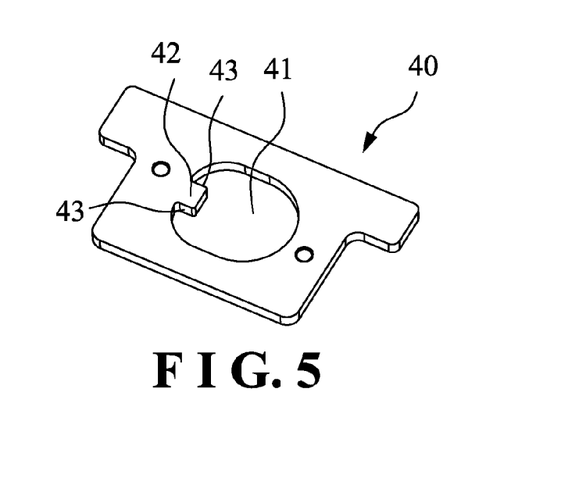
FIG. 5 is an enlarged view of the metallic spacer according to the first embodiment of the present invention.

As shown in FIG. 2 and FIG. 5, the accommodation chamber 25 of the cover 20 is provided with a metallic spacer 40. The metallic spacer 40 is a 凸-shaped flat plate. The metallic spacer 40 is received in the accommodation chamber 25 and fitted out of the eccentric action portion 312 of the eccentric driving cam 30. The metallic spacer 40 has an opening 41 corresponding in position, size and shape to the through hole 26 of the cover 20. The metallic spacer 40 has a protruding block 42 which is located at the left side of the opening 41. The protruding block 42 corresponds in size and shape to the limit block 27. The protruding block 42 has two third limit surfaces 43 at two sides thereof. The thickness of the limit block 27 and the protruding block 42 is the same as that of the eccentric action portion 312. When the cover is slid to the predetermined position relative to the insulation base 10, the second stop surfaces 315 are stopped by the third limit surfaces 43.

To assemble the present invention, the cover 20 is slidably connected to the insulation base 10 top-down, and then the cover 20 and the insulation base 10 are pressed with both hands so that the engaging blocks 13 at the two sides of the insulation base 10 are engaged with the engaging hooks at the two flanges 22 of the cover 20, not shown in the drawings. After that, the through hole 26 of the cover platform 24 is aligned with the opening 41 of the metallic spacer 40 and the limit block 27 faces the protruding block 42. The eccentric driving cam 30 is inserted in the opening 41 of the metallic spacer 40, the through hole 26 of the cover 20, and the axle hole 15 of the insulation base 10 in sequence. The operation head 311 of the eccentric driving cam 30 is engaged out of the metallic spacer 40. The eccentric action portion 312 is located in the opening 41 and the through hole 26. The limit portion 321 is located in the limit recess 16 of the insulation base 10. Finally, the rivet plate 34 is fitted on the rivet portion 33, and the rivet portion 33 is struck to be enlarged so that the rivet plate 34 is coupled to the eccentric driving cam 30 and won't disengage from the rivet portion 33.

Figure 9:
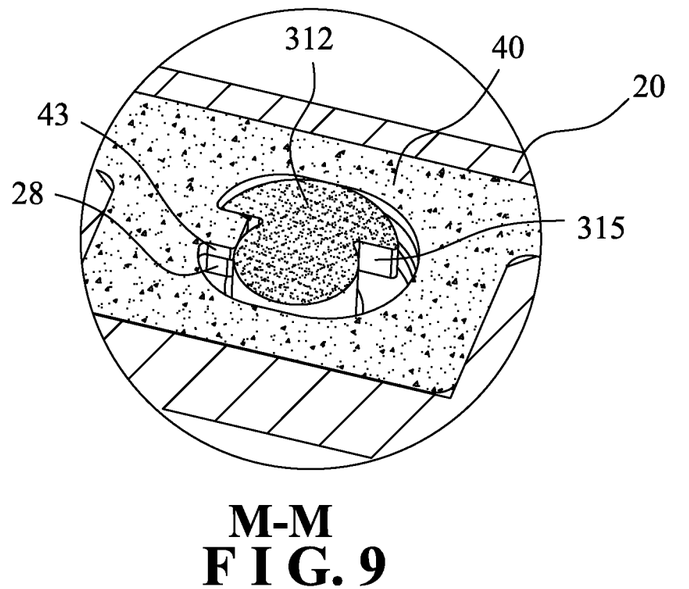
FIG. 9 is a sectional view taken along line M-M of FIG. 8.
Figure 10:
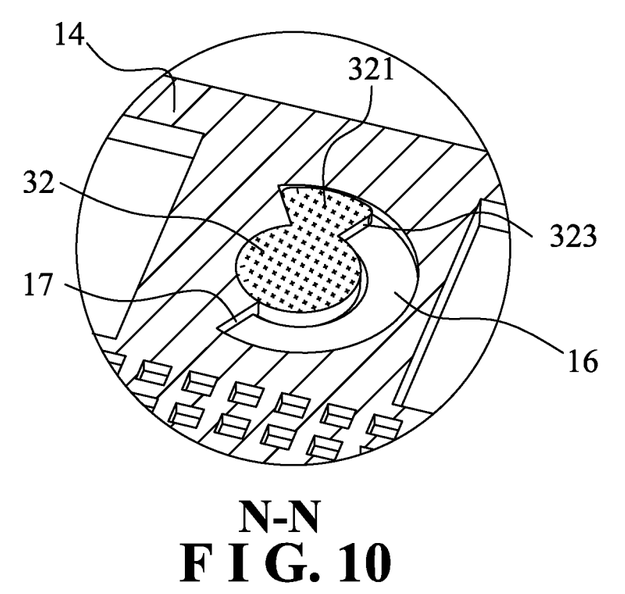
FIG. 10 is a sectional view taken along line N-N of FIG. 8.
Figure 11:
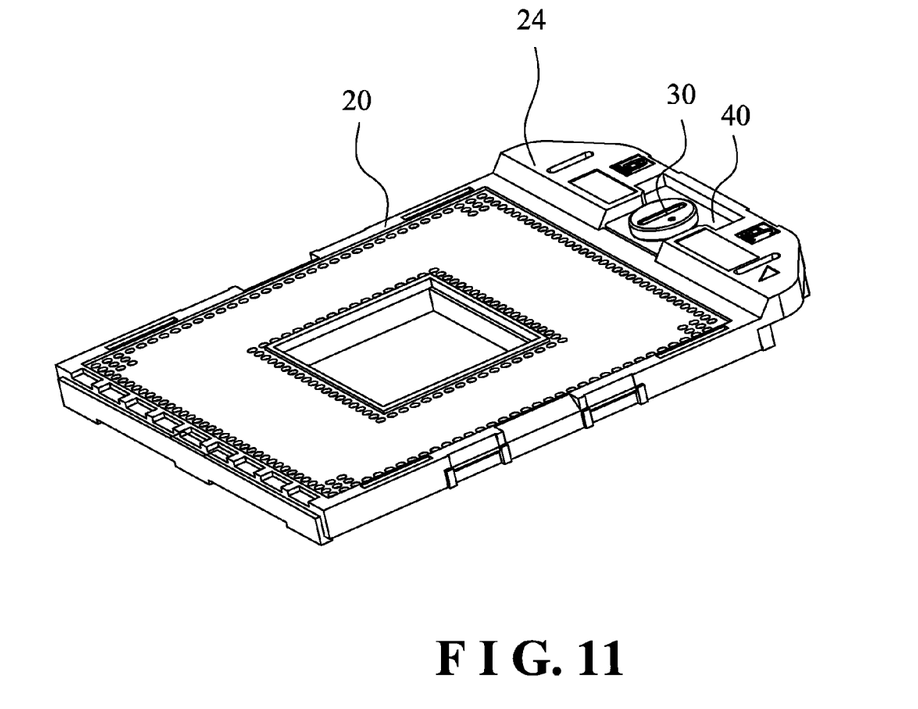
FIG. 11 is a perspective view according to a second embodiment of the present invention.
Figure 12:
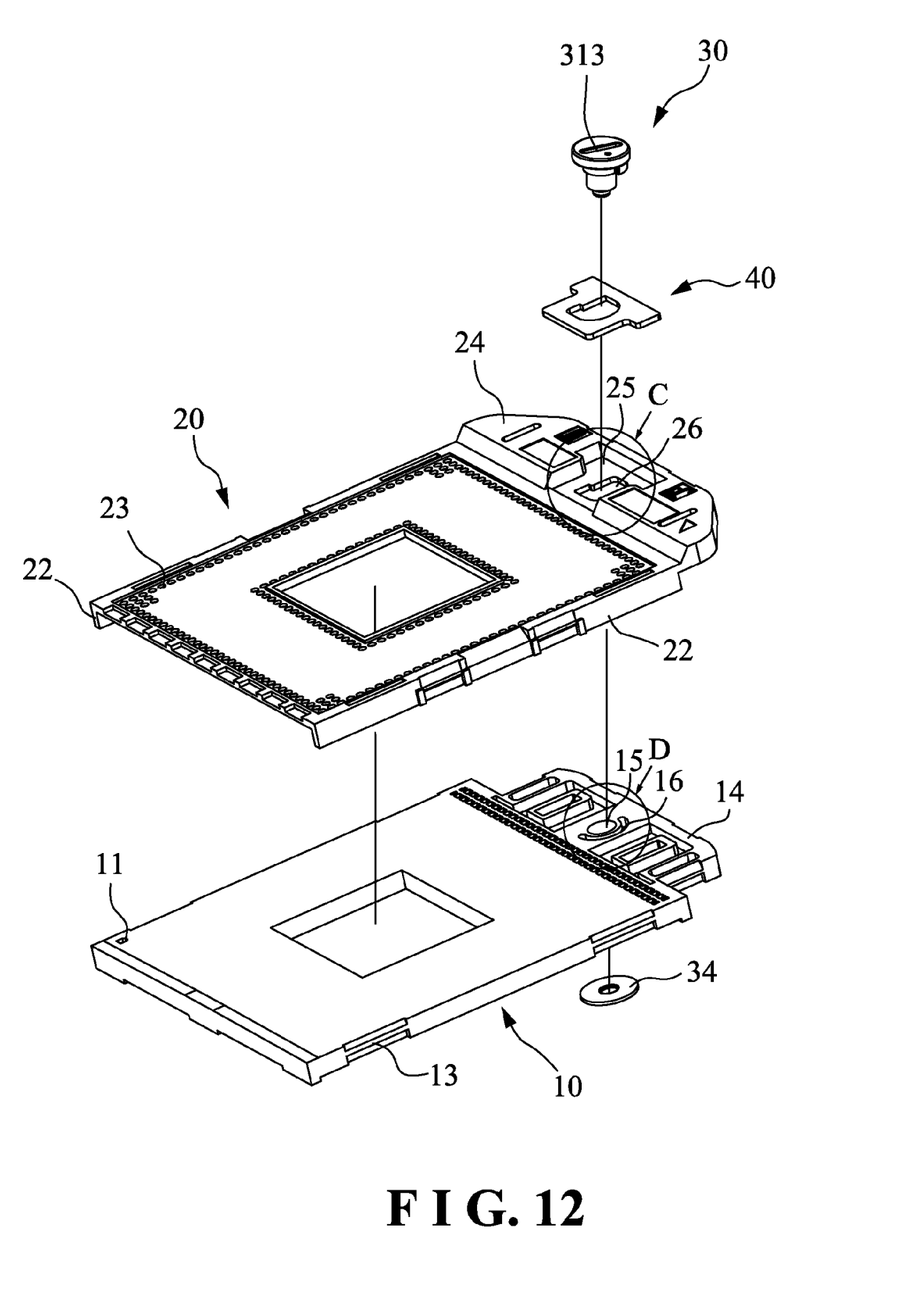
FIG. 12 is an exploded view according to the second embodiment of the present invention.
Figure 13:
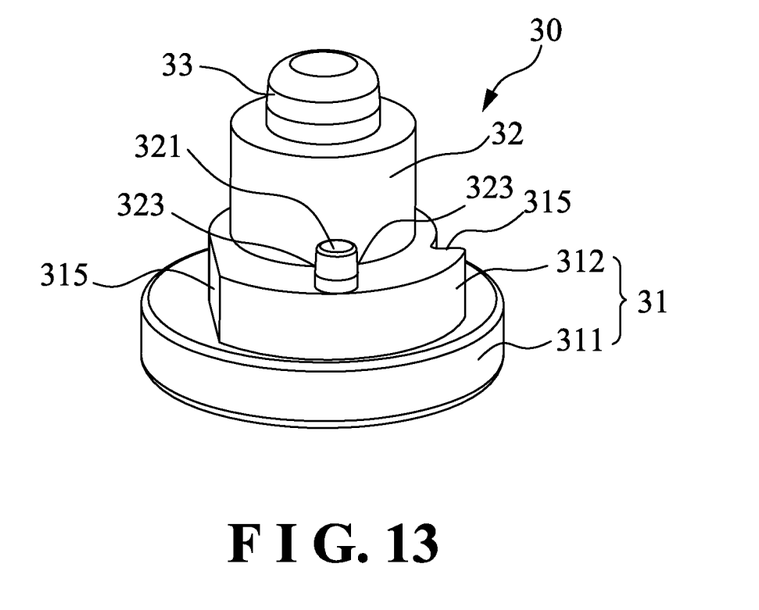
FIG. 13 is an enlarged view of the eccentric driving cam according to the second embodiment of the present invention.
Figure 14:
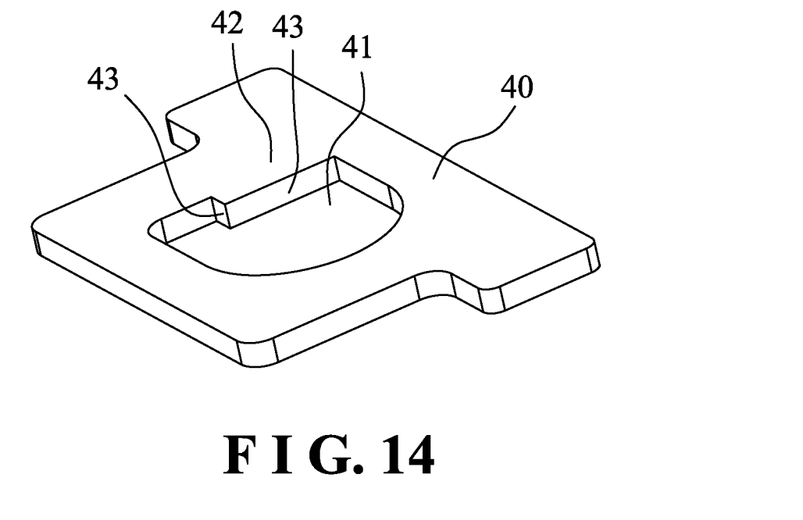
FIG. 14 is an enlarged view of the metallic spacer according to the second embodiment of the present invention.
Figure 15:
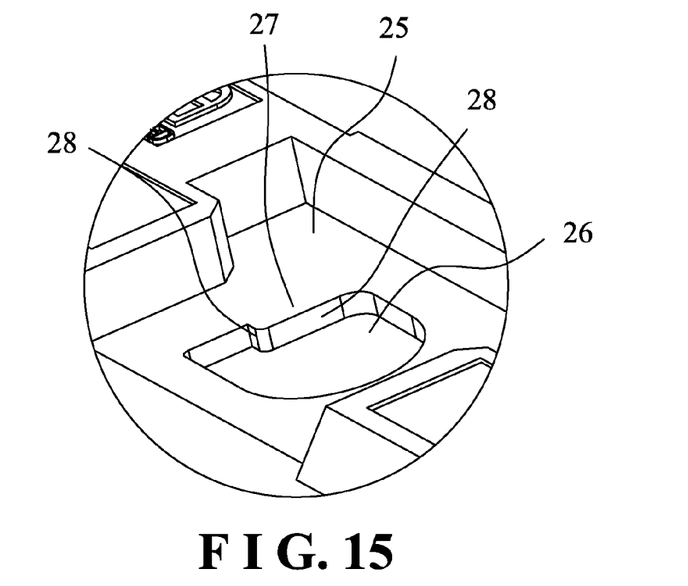
FIG. 15 is an enlarged view of the circle C in FIG. 12.
Figure 16:
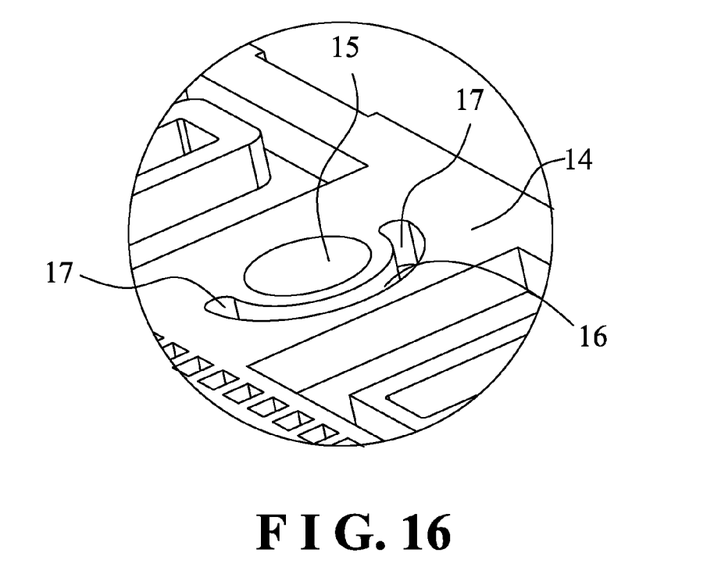
FIG. 16 is an enlarged view of the circle D in FIG. 12.
Figure 17:
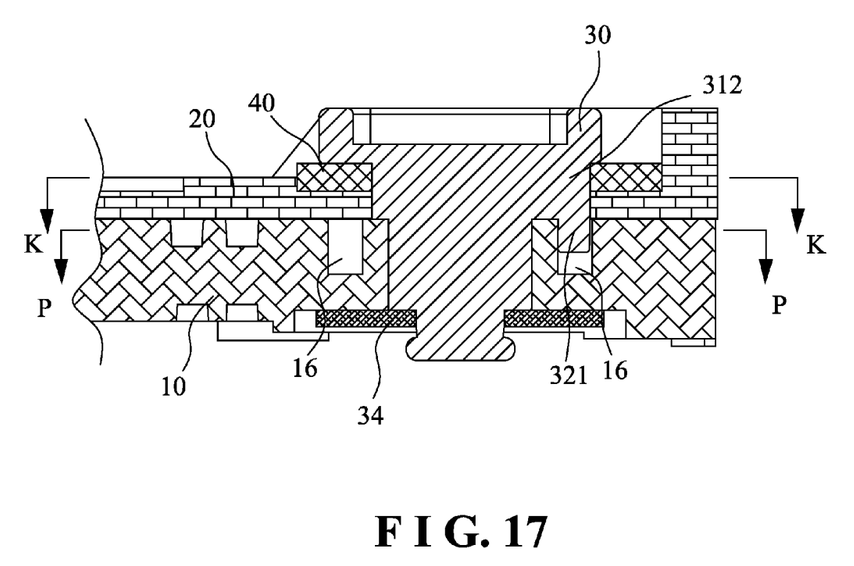
FIG. 17 is a cross-sectional view according to the second embodiment of the present invention.
Figure 18:
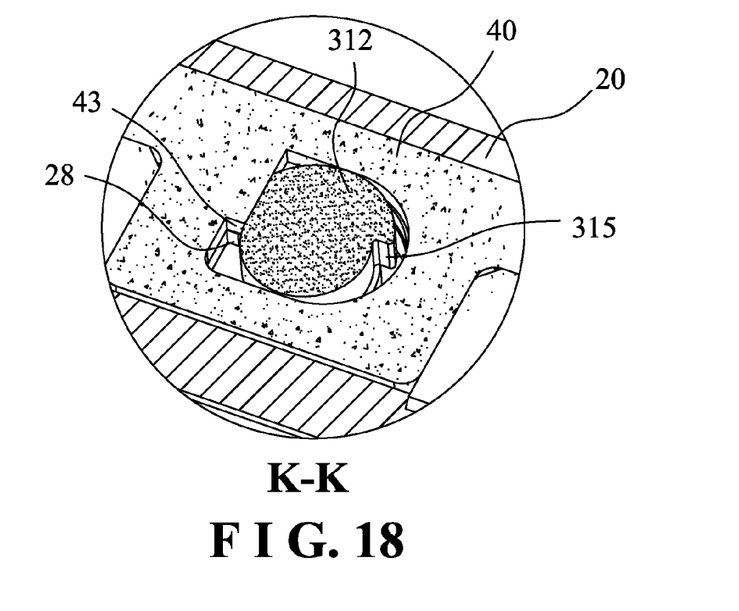
FIG. 18 is a sectional view taken along line K-K of FIG. 17.
Figure 19:
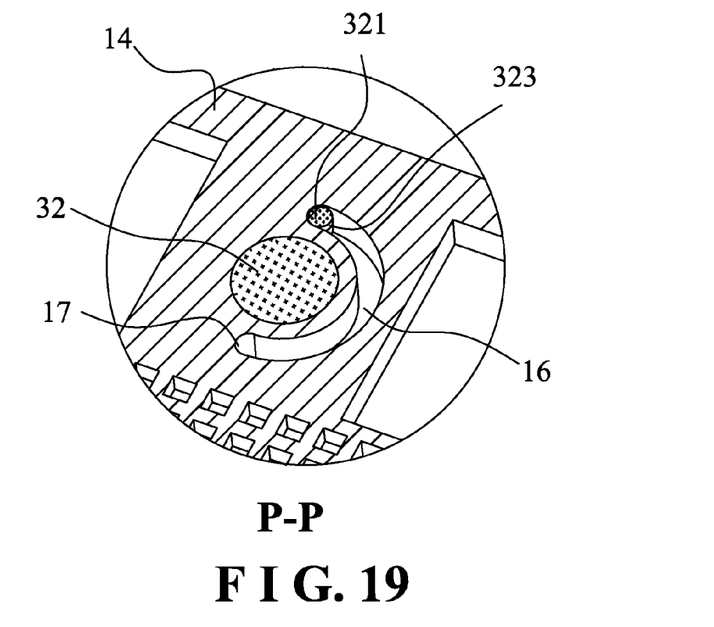
FIG. 19 is a sectional view taken along line P-P of FIG. 17.

As shown in FIG. 8 to FIG. 10, when in use, in order to disengage the electric connector from the coupled central processing unit, an external force is applied to the notch 313 of the operation head 31 to turn the eccentric driving cam 30 counterclockwise, such that the eccentric driving cam 30 drives the cover 20 to move rearward relative to the insulation base 10. When the eccentric driving cam 30 is turned to a certain degree, the cover 20 is stopped and cannot be further moved. The eccentric action portion 312 of the eccentric driving cam 30 is stopped by the second limit surfaces 28 and the third limit surfaces 43, and the stop portion 321 is stopped by the first limit surfaces 17 of the fan-shaped limit recess 16 of the insulation base 10, providing a multi-stop effect to the eccentric driving cam 30. At this time, the pins of the central processing unit disengage from the socket terminals in the lower receiving holes 11 of the insulation base 10, so the conductive state is changed to a disconnection state.

In order to conduct the electric connector and the coupled central processing unit, an external force is applied to the notch 313 of the operation head 31 in the reverse direction.

FIGS. 11 to 19 show a second embodiment of the present invention, which is substantially similar to the first embodiment with the exceptions described hereinafter. In the second embodiment, the limit recess 16 is in an arc shape and separate from the axle hole 15. A distance is defined between the limit recess 16 and the axle hole 15 to provide a slide rack to the stop portion 321. The stop portion 321 is a cylindrical post extending from the bottom of the eccentric action portion 312. The height of the stop portion 321 is smaller than the depth of the limit recess 16. The first surfaces 17 are the two ends of the cylindrical post. The through hole 26 is in a D shape having an arc surface and an upright surface. The limit block 27 is a protrusion protruding from the inner wall of the through hole 26. The protruding direction of the limit block 27 is perpendicular to the sliding direction of the cover 20. The limit block 27 has two second limit surfaces 28 at two adjacent side walls thereof. The two second limit surfaces 28 are perpendicular to each other. One of the two second limit surfaces 28 is parallel to the sliding direction of the cover 20, and the other of the two second limit surfaces 28 is perpendicular to the sliding direction of the cover 20. The driving portion 31 comprises an operation head 311 and an eccentric action portion 312. The eccentric action portion 312 has two second stop surfaces 315 at two ends thereof. The two stop surfaces 315 are perpendicular to each other. The opening hole 41 of the metallic spacer 40 corresponds in shape to the through hole 26, having a D shape. The protruding block 42 in the opening 41 corresponds in position to the limit block 27. The protruding block 42 is located at the upper left side of the opening 41. The protruding block 42 has two third limit surfaces 43 at two adjacent side walls thereof and perpendicular to each other.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. An electric connector, comprising:
    an insulation base, the insulation base having a plurality of lower receiving holes thereon, an axle hole which is disposed at a portion not having the lower receiving holes and a limit recess which surrounds the axle hole, the limit recess having two first limit surfaces at two ends thereof;
    a cover slidably connected to the base, the cover having a plurality of upper receiving holes thereon corresponding to the lower receiving holes, a through hole which is disposed at a portion not having the upper receiving holes and corresponds in position to the axle hole, and a limit block at one side of the through hole, the limit block having two second limit surfaces at two sides thereof; and
    an eccentric driving cam connected to the insulation base and the cover, the eccentric driving cam comprising a driving portion and a rotation axle, the driving portion having two second stop surfaces at two ends thereof, the rotation axle having a stop portion thereon, the stop portion extending into the limit recess, the stop portion having two first stop surfaces at two ends thereof;
    wherein the eccentric driving cam drives the cover to slide relative to the insulation base by a torsion action, when sliding to a predetermined position, the first stop surfaces are stopped by the first limit surfaces and the second stop surfaces are stopped by the second limit surfaces.

2. The electric connector as claimed in claim 1, wherein the driving portion comprises an operation head and an eccentric action portion, two ends of the eccentric action portion forming the two second stop surfaces, the two second stop surfaces being coplanar.

3. The electric connector as claimed in claim 2, wherein the limit recess has a fan-shaped shape and communicates with the axle hole, the stop portion being a fan-shaped block which extends from the rotation axle and is integrally formed with a bottom of the eccentric action portion.

4. The electric connector as claimed in claim 1, wherein the driving portion comprises an operation head and an eccentric action portion, two ends of the eccentric action portion forming the two second stop surfaces, the two second stop surfaces being perpendicular to each other.

5. The electric connector as claimed in claim 4, wherein the limit recess is in an arc shape and separate from the axle hole, a distance defined between the limit recess and the axle hole, the stop portion is a cylindrical post integrally formed with a bottom of the eccentric action portion.

6. The electric connector as claimed in claim 1, wherein the limit block protrudes from an inner wall of the through hole in a direction perpendicular to a sliding direction of the cover, two side walls the limit block forming the two second limit surfaces, the two second limit surfaces being parallel to each other and perpendicular to the sliding direction of the cover.

7. The electric connector as claimed in claim 1, wherein the limit block protrudes from an inner wall of the through hole in a direction perpendicular to a sliding direction of the cover, two side walls the limit block forming the two second limit surfaces, the two second limit surfaces being perpendicular to each other, one of the two second limit surfaces being parallel to the sliding direction of the cover, the other of the two second limit surfaces being perpendicular to the sliding direction of the cover.

8. The electric connector as claimed in claim 7, wherein the through hole is in a D shape having an arc surface and an upright surface, the limit block extending from the upright surface.

9. The electric connector as claimed in claim 1, wherein the cover comprises a cover platform extending from a side thereof, the cover platform having an accommodation chamber thereon, the through hole being disposed in the accommodation chamber, the metallic spacer being received in the accommodation chamber and fitted out of the driving portion of the eccentric driving cam, the metallic spacer having an opening corresponding in position, size and shape to the through hole of the cover, the metallic spacer having a protruding block which is located at a side of the opening, the protruding block corresponding in size and shape to the limit block, the protruding block having two third limit surfaces at two sides thereof, the second stop surfaces being stopped by the third limit surfaces.

\* \* \* \* \*